US006951995B2

(12) United States Patent
Couch et al.

(10) Patent No.: US 6,951,995 B2
(45) Date of Patent: Oct. 4, 2005

(54) METHOD AND SYSTEM FOR HIGH-SPEED, PRECISE MICROMACHINING AN ARRAY OF DEVICES

(75) Inventors: Bruce L. Couch, North Attleboro, MA (US); Jonathan S. Ehrmann, Sudbury, MA (US); Yun Fee Chu, Natick, MA (US); Joseph V. Lento, Methuen, MA (US); Shepard D. Johnson, Andover, MA (US)

(73) Assignee: GSI Lumonics Corp., Billerica, MA (US)

( * ) Notice: Subject to any disclaimer, the term of this patent is extended or adjusted under 35 U.S.C. 154(b) by 209 days.

(21) Appl. No.: 10/397,541

(22) Filed: Mar. 26, 2003

(65) Prior Publication Data

US 2004/0009618 A1 Jan. 15, 2004

Related U.S. Application Data

(63) Continuation-in-part of application No. 10/108,101, filed on Mar. 27, 2002.
(60) Provisional application No. 60/368,421, filed on Mar. 28, 2002.

(51) Int. Cl.[7] ..................... B23K 26/14; B23K 26/16; H01L 21/00
(52) U.S. Cl. ..................... 219/121.67; 219/121.68; 438/13
(58) Field of Search ............... 219/121.67, 121.68; 438/13, 382

(56) References Cited

U.S. PATENT DOCUMENTS

| 4,399,345 A | 8/1983 | Lapham et al. |
| 4,429,298 A | 1/1984 | Oberholzer |
| 4,511,607 A | 4/1985 | White |
| 4,551,607 A | 11/1985 | Moy |
| 4,647,899 A | 3/1987 | Moy |
| 4,853,671 A | 8/1989 | Iversen et al. |

(Continued)

FOREIGN PATENT DOCUMENTS

| JP | 62160726 | 7/1987 |
| JP | 2005-104266 | 4/1993 |
| WO | WO 9940591 | 8/1999 |
| WO | WO 0073013 | 12/2000 |

OTHER PUBLICATIONS

Wagner, Richard, Functional Laser Trim Architecture—Tuned for Speed and Accuracy, Westwood, Massachusetts, Hybrid Circuit Technology, Jul. 1985, pp. 1–5.
Aghamirzadeh, Maryam, Choosing the Right Laser for Trim Quality, Hybrid Circuit Technology, Jul. 1985, pp. 1–3.
Dow, Robert, et al., Reducing Post–Trim Drift of Thin–Film Resistors by Optimizing YAG Laser Output Characteristics, IEEE Transactions on Components, Hybrids, J. Mfg. Tech., vol. CHMT–1, Dec. 1978, PP. 392–397.
Link Cutting/Making, Handbook Of Laser Materials Processing, Chapter 19, pp. 595–615, Laser Institute of America (2001).
Trimming, LIA Handbook of Laser Materials Processing, Chapter 17, pp. 583–588.

*Primary Examiner*—Alexander Ghyka
(74) *Attorney, Agent, or Firm*—Brooks Kushman, P.C.

(57) ABSTRACT

A method and system for high-speed, precise micromachining an array of devices are disclosed wherein improved process throughput and accuracy, such as resistor trimming accuracy, are provided. The number of resistance measurements are limited by using non-measurement cuts, using non-sequential collinear cutting, using spot fan-out parallel cutting, and using a retrograde scanning technique for faster collinear cuts. Non-sequential cutting is also used to manage thermal effects and calibrated cuts are used for improved accuracy. Test voltage is controlled to avoid resistor damage.

30 Claims, 10 Drawing Sheets

U.S. PATENT DOCUMENTS

| | | |
|---|---|---|
| 4,901,052 A | 2/1990 | Chapel et al. |
| 4,962,294 A | 10/1990 | Beckham et al. |
| 5,087,987 A | 2/1992 | Simbal |
| 5,104,480 A | 4/1992 | Wojarowski et al. |
| 5,111,325 A | 5/1992 | DeJager |
| 5,233,327 A | 8/1993 | Bartush et al. |
| 5,404,247 A | 4/1995 | Cobb et al. |
| 5,569,398 A | 10/1996 | Sun et al. |
| 5,633,736 A | 5/1997 | Griffith et al. |
| 5,675,310 A | 10/1997 | Wojarowski et al. |
| 5,685,995 A | 11/1997 | Sun et al. |
| 5,751,585 A | 5/1998 | Cutler et al. |
| 5,753,391 A | 5/1998 | Stone et al. |
| 5,796,392 A | 8/1998 | Eglit |
| 5,808,272 A | 9/1998 | Sun et al. |
| 5,835,280 A | 11/1998 | Griffith |
| 5,838,355 A | 11/1998 | Narayan et al. |
| 5,849,623 A | 12/1998 | Wojarowski et al. |
| 5,864,430 A | 1/1999 | Dickey et al. |
| 5,865,832 A | 2/1999 | Knopp et al. |
| 5,969,877 A | 10/1999 | Maeda |
| 5,976,392 A | 11/1999 | Chen |
| 6,031,561 A | 2/2000 | Narayan et al. |
| 6,281,471 B1 | 8/2001 | Smart |
| 6,294,778 B1 | 9/2001 | Cappiello |
| 6,322,711 B1 | 11/2001 | Chen |
| 6,462,306 B1 | 10/2002 | Kitai et al. |
| 6,510,605 B1 | 1/2003 | Smejkal et al. |
| 6,534,743 B2 | 3/2003 | Swenson et al. |
| 6,664,500 B2 | 12/2003 | Wilbur et al. |
| 6,703,582 B2 | 3/2004 | Smart et al. |
| 6,727,458 B2 | 4/2004 | Smart |
| 6,738,396 B2 | 5/2004 | Filgas et al. |
| 2001/0045419 A1 | 11/2001 | Dunsky et al. |
| 2003/0042230 A1 | 3/2003 | Gross et al. |
| 2003/0172527 A1 | 9/2003 | Rital et al. |
| 2003/0178396 A1 | 9/2003 | Navmov et al. |
| 2004/0009618 A1 * | 1/2004 | Couch et al. .................. 438/13 |

* cited by examiner

| Cut Type | Name | Application | Resistor Geometry | Tolerance Expected | Stability | Speed |
|---|---|---|---|---|---|---|
| | Plunge | Medium value change; 10-30% range of adjustment | Top Hat or square | 1% | Fair | Fast |
| | L-cut | Medium - high value change; 10-60% range of adjustment | Rectangle | <1% | Very good | Medium |
| | Serpentine | High-value change; | Rectangle | 1% | Poor | Slow |
| | Double plunge | Medium value change; good accuracy | Rectangle | <1% | Good | Medium |
| | Measure predict L-cut | Medium - high value change; high accuracy | Rectangle | 0.5% | Very good | Slow |
| | Measure predict plunge | Low - medium value change with good accuracy | Top Hat or square | <1% | Fair | Slow |
| | Curved L | Medium value change; reduced hot spot at turn | Rectangle | <1% | Very good | Medium |
| | Curved J | Similar to curved-L; high accuracy | Rectangle | <1% | Very good | Medium |
| | Curve U | Medium value change | Rectangle | 1% | Very good | Slow |
| | Curved U with isolation cuts | Used in high-voltage applications | Rectangle | 1% | Good | Slow |
| | Non-orthoganal plunge | Pot trimming | Circular | ------ | Fair | Slow |

*Fig. 1c (PRIOR ART)*

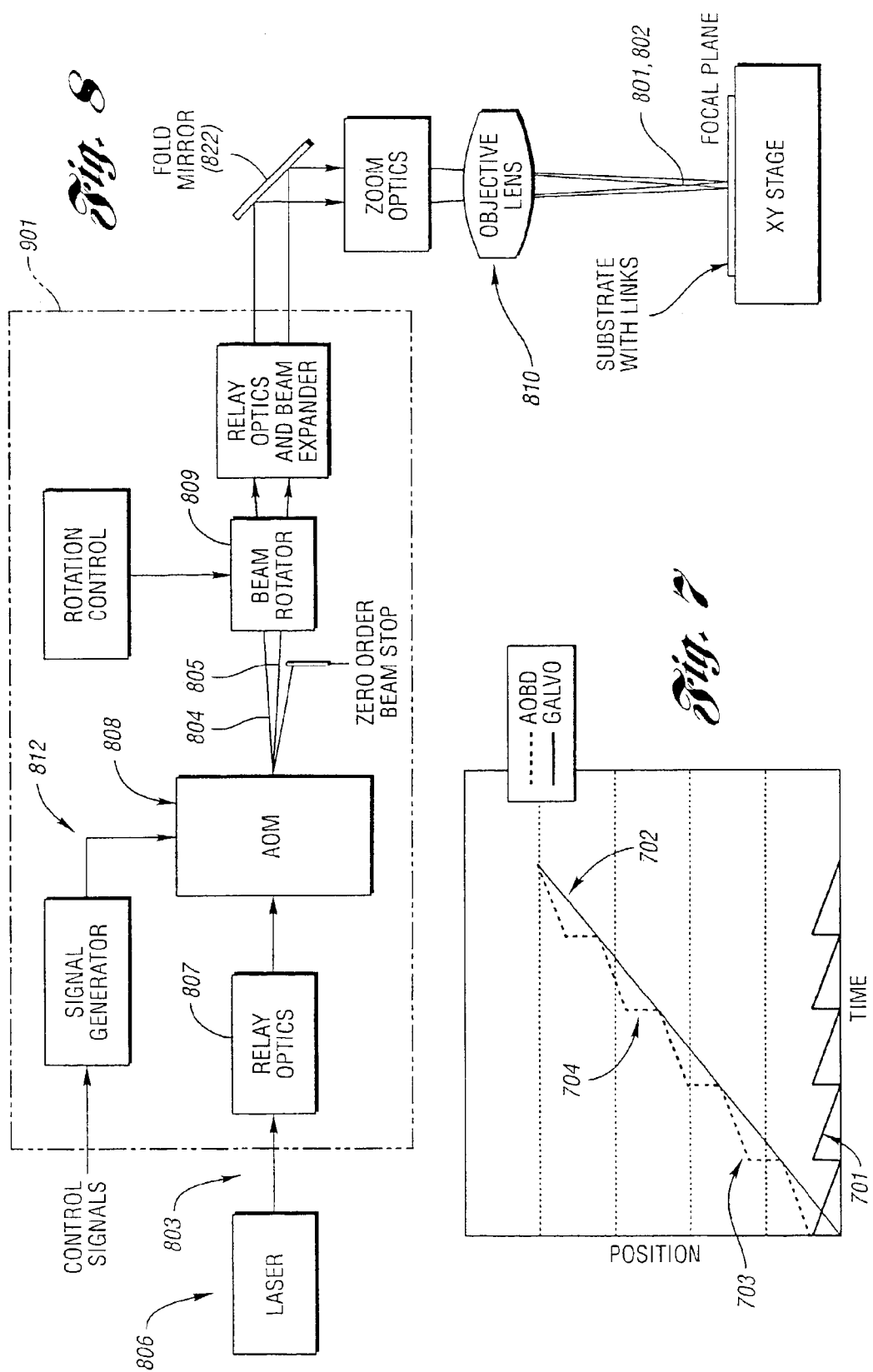

METHOD AND SYSTEM FOR HIGH-SPEED, PRECISE MICROMACHINING AN ARRAY OF DEVICES

CROSS-REFERENCE TO RELATED PATENTS AND APPLICATIONS

This application claims the benefit of U.S. provisional application Ser. No. 60/368,421, filed 28, Mar. 2002, entitled "Laser Based Micro-Machining Method And System, and an Application To High Speed Laser Trimming Of Chip Components And Similar Structures." This application also claims priority to and is a continuation-in-part application of U.S. patent application Ser. No. 10/108,101, entitled "Method for Processing a Device, Method and System for Modeling Same and the Device," filed 27, Mar. 2002, now published U.S. patent application No. 2002/0162973. U.S. Pat. No. 6,341,029, entitled "Method and Apparatus for Shaping a Laser-Beam Intensity Profile by Dithering," assigned to the assignee of the present invention with a common inventor, is hereby incorporated by reference in its entirety. This application is also related to U.S. Pat. No. 6,339,604, entitled "Pulse Control In Laser Systems," also assigned to the assignee of the present invention. This application is also related to co-pending U.S. patent application Ser. No. 10/107,027, filed 27, Mar. 2002, now published U.S. patent application No. 2002/0170898, entitled "High Speed, Laser Based Method and System for Processing Material of One or More Targets Within a Field" also assigned to the assignee of the present invention.

BACKGROUND OF THE INVENTION

1. Field of the Invention

This invention relates to methods and systems for high-speed, precise micromachining of an array of devices. This invention also relates to the field of resistor trimming, particularly trimming of serpentine resistors on thin film block structures. Laser resistor trimming involves laser-processing cuts in an area of resistive material between conductors.

2. Background Art

Resistor trimming (as well as trimming and micromachining of other electronic components and circuits) has evolved over the laser 20 years and is now used for adjusting circuits for thick film, thin film, and other electronic technologies. The publication "Trimming," LIA Handbook of Laser Materials Processing, Chapter 17, pages 583–588, 2001 contains contributions describing several aspects of laser trimming. FIGS. 1a–1c of the present application are incorporated from the publication. FIG. 1a illustrates current flow lines of an untrimmed resistor, whereas FIG. 1b illustrates an effect of laser trimming on the current flow lines. FIG. 1c summarizes several results (stability, speed, and tolerances) with various resistor geometries and cut types.

The following exemplary U.S. patents are related to laser trimming methods and systems: U.S. Pat. Nos. 6,510,605; 6,322,711; 5,796,392; 4,901,052; 4,853,671; 4,647,899; 4,511,607; and 4,429,298.

U.S. Pat. No. 4,429,298 relates to many aspects of serpentine trimming. Basically, a serpentine resistor is formed with sequential plunge cuts and a final trim cut is made parallel to the resistor edge from the last plunge. It describes "progressively" making plunge cuts on a resistor alternately from one end, considers maximum and minimum plunge cut lengths, a resistance threshold of the plunge cuts for the trim cut, a faster cutting speed for plunge cuts, and a structured process flow with various resistance and cut length tests.

There is a continuing need for improved high-speed, micromachining such as precise trimming at all scales of operation, ranging from thick film circuits to wafer trimming.

SUMMARY OF THE INVENTION

An object of the present invention is to provide an improved method and system for high-speed, precise micromachining an array of devices.

In carrying out the above object and other objects of the present invention, a method is provided for high-speed, precise micromachining an array of devices. Each of the devices has at least one measurable property. The method includes the steps of: a) selectively micromachining a device in the array to vary a value of a measurable property; b) suspending the step of selectively micromachining; c) while the step of selectively micromachining is suspended, selectively micromachining at least one other device in the array to vary a value of a measurable property; and d) resuming the suspended step of selectively micromachining to vary a measurable property of the device until its value is within a desired range.

The devices may be resistors.

The resistors may be film resistors.

The steps of selectively micromachining may be performed with at least one laser beam which cuts the devices.

The method may further include measuring one measurable property of at least one of the devices to obtain a measured value.

The method may further include comparing the measured value with a predetermined threshold to obtain a comparison and micromachining at least one of the other devices based on the comparison.

The method may further include selectively micromachining at least one of the other devices based on the measured value.

The method may further include determining not to measure a measurable property of at least one of the other devices based on the measured value.

The method may be for high-speed, precise laser trimming an array of resistors, and one of the measurable properties may be resistance.

Each of the steps of selectively micromachining may include the step of selectively removing material.

The array may include at least one of one or more rows and one or more columns.

At least one of the steps of selectively micromachining may be performed with a plurality of focused laser pulses to irradiate a plurality of devices substantially simultaneously.

At least one of the steps of selectively micromachining may be performed with a plurality of focused laser pulses. The method may further include distributing the focused laser pulses.

The step of distributing may include the steps of producing a distribution pattern with a plurality of laser beams and focusing the laser beams.

The laser trimming may produce a series of interdigited cuts in an area of resistive material between conductors of the resistors.

At least one of the steps of selectively micromachining may include the steps of positioning a laser beam at a location of each of the devices to be micromachined and selectively irradiating at least a portion of each of the devices to be micromachined with at least one laser pulse.

At least one of the steps of selectively micromachining may include the steps of generating and relatively positioning a laser beam to travel in a first direction within a field of the array and selectively irradiating at least a portion of at least one device within the field with at least one laser pulse.

The method may further include generating and relatively positioning a laser beam to travel in a second direction substantially opposite the first direction within the field and selectively irradiating at least a second portion of at least one device within the field with at least one laser pulse.

At least one of the steps of selectively micromachining may include the steps of generating and relatively positioning a laser beam to travel in a first scanning pattern across the devices, superimposing a second scanning pattern with the first scanning pattern and irradiating at least one device with at least one laser pulse.

The second scanning pattern may be a retrograde scan, and scan speed of the at least one laser pulse irradiating the at least one device is lower than a corresponding scan speed of the first scanning pattern. Laser energy may be concentrated at the at least one device for a period of time longer than a period of time associated with only the first scanning pattern whereby throughput is improved.

The second scanning pattern may include a jump from a first device to a second device.

The steps of selectively micromachining may be performed with a plurality of laser pulses, and at least one of the pulses may have an energy in the range of 0.1 microjoules to 25 millijoules.

The measured value may be a measured temperature value.

The devices may be substantially identical.

Further in carrying out the above objects and other objects of the present invention, a system is provided for high-speed, laser-based, precise micromachining an array of devices. Each of the devices has at least one measurable property. The system includes a pulsed laser subsystem. An optical subsystem is coupled to the pulsed laser system to selectively irradiate a portion of a device with a laser pulse. A controller is coupled to the subsystems to control the subsystems to: a) selectively micromachine a device in the array to vary a value of a measurable property; b) suspend the selective micromachining; c) while the selective micromachining is suspended, selectively micromachine at least one other device in the array to vary a value of a measurable property; and d) resume the selective micromachining to vary a measurable property of the device until its value is within a desired range.

The optical subsystem may include a beam deflector and a beam deflector controller for controlling the beam deflector to scan a laser beam along a first scan pattern which includes each of the devices to be micromachined.

The system may further include a measurement subsystem to measure one of the measurable properties of at least one of the devices.

The micromachining may be laser trimming and the array is an array of resistors, and the measurement subsystem may be a probe array.

The optical subsystem may include a second beam deflector to superimpose a higher-speed, second scan pattern on the first scan pattern whereby throughput of the system is improved.

The controller may be coupled to the subsystems so that the subsystems are controlled to generate a trimming sequence for at least one of the devices that reduces device temperature during micromachining.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1c is a chart which illustrates the effect of various cut types on several trim parameters;

FIG. 2b is a block diagram flow chart further defining trimming steps corresponding to FIG. 2a;

FIG. 4b is a block diagram flow chart further defining trimming steps corresponding to FIG. 4a;

FIG. 6a is a schematic view of a laser trimming system which may be used in at least one embodiment of the invention;

FIG. 6b is a schematic view of a resistor which has geometric properties to be measured, specifically edges of the resistor, using data obtained with the system of FIG. 6a;

FIG. 7 is a graph which shows position of a laser beam versus time during scanning of a resistor array in one embodiment wherein a fast scan with a solid state deflector is superimposed with a electromechanical linear scan to selectively form the cuts of either FIG. 2 or FIG. 4 at increased speed;

FIG. 8 is a schematic view of a system delivering multiple focused beams to at least one resistor so as to increase trimming speed.

DETAILED DESCRIPTION OF THE PREFERRED EMBODIMENTS

High-Speed Serpentine Trimming Process

Figure 1A:
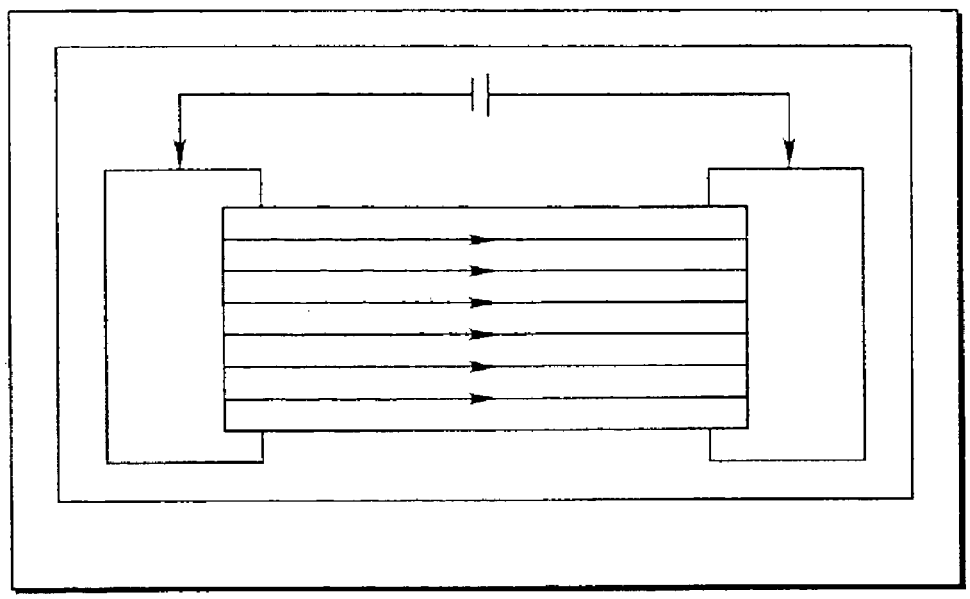
FIGS. 1a–1b are schematic views which illustrate current flow lines before and after laser trimming, respectively.
Figure 1B:
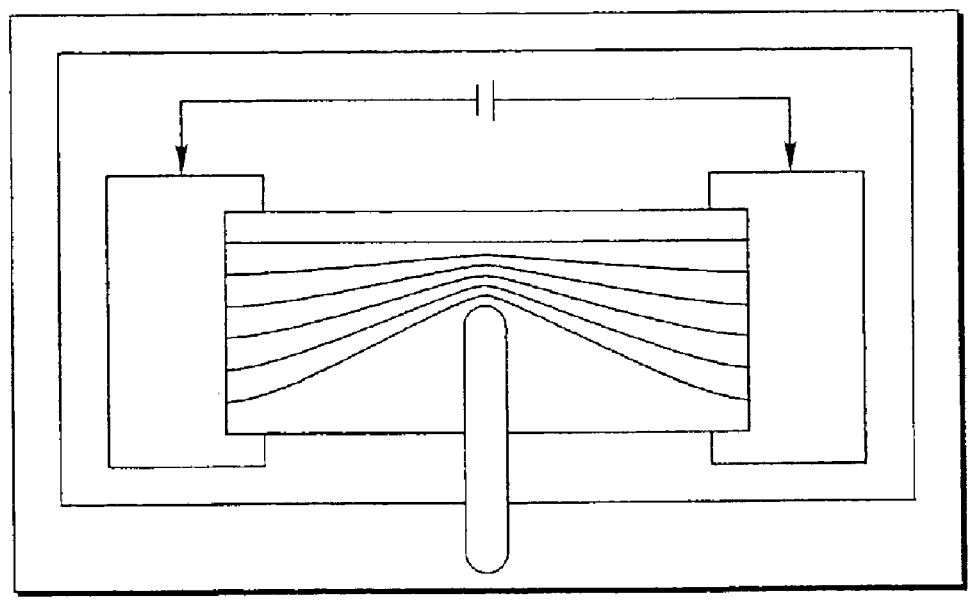
Figure 2A:
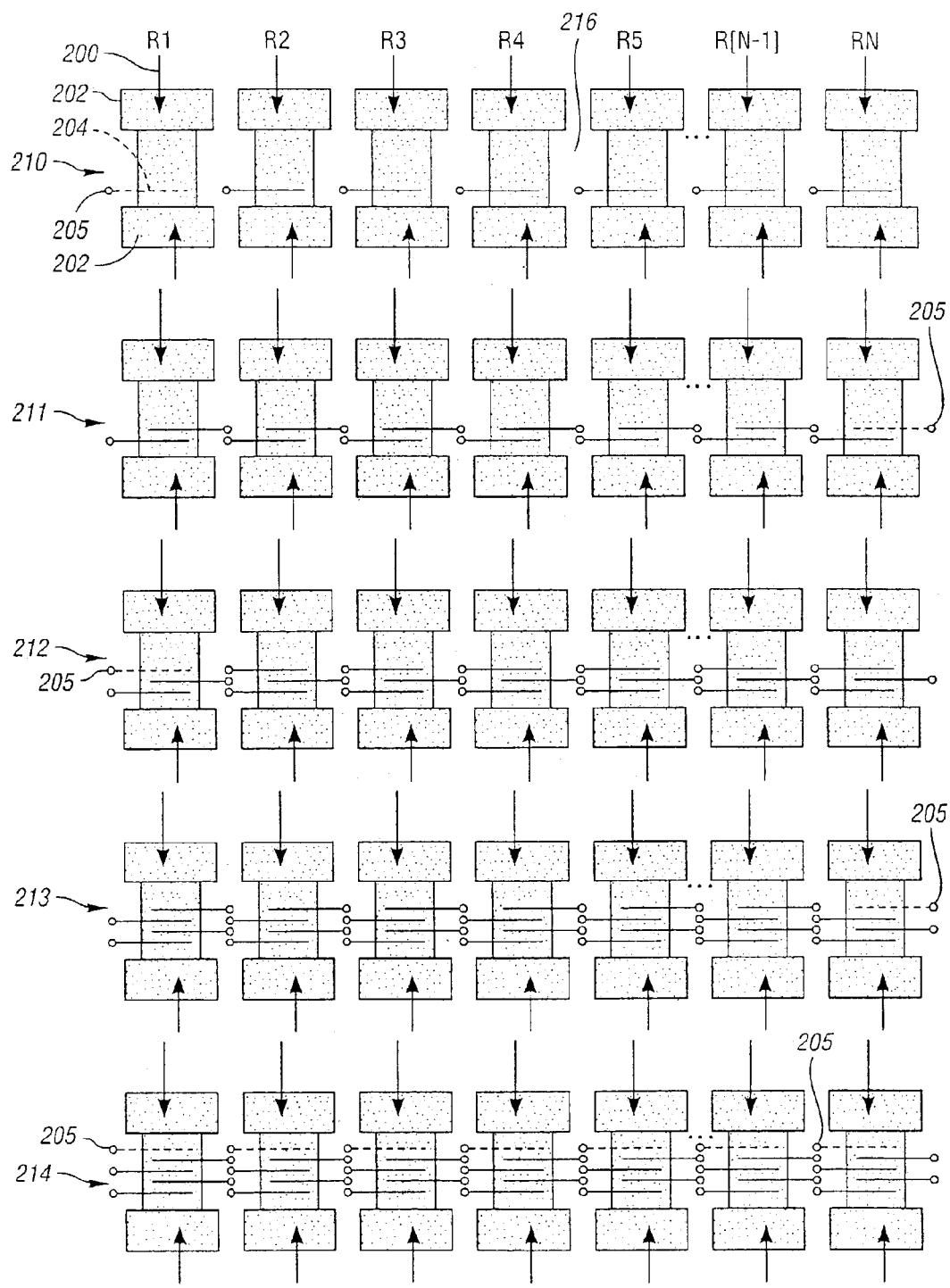
FIG. 2a is a schematic view of an array of chip resistors arranged in rows and columns and which illustrates results using laser trimming steps in accordance with an embodiment of the present invention.

In resistor trimming, the cuts direct the current flowing through the resistive material along a resistance path. Fine control and adjustment of the cut size and shape change the resistance to a desired value, as illustrated in FIGS. 1a–1c. Typically, chip resistors are arranged in rows and columns on a substrate. FIG. 2a shows an arrangement wherein a row of resistors R1, R2, . . . . RN is to be processed. A probe array, having a probe 200 and depicted by arrows in FIG. 2a, is brought into contact 202 with the conductors of a row of resistors. A matrix switch addresses the contacts for a first pair of conductors (e.g.: contacts across R1) and a series of cuts and measurements is performed to change the resistance between the conductor pair to a desired value. When the trimming of a resistor is complete, the matrix switches to a second set of contacts at the next row element (e.g.: R2) and the trimming process is repeated. When a complete row of resistors (R1 . . . RN) has been trimmed, contact is broken between the contacts and the probe array. The substrate is then relatively positioned to another row, the probe array is brought into contact, and a second row is processed in the manner as the preceding row.

The trimming of serpentine thin film resistors, for instance as illustrated in FIG. 1c, involves laser processing to create interdigitated cuts in an area of resistive material between conductors. The interdigitated cuts direct current flowing through the resistive material along a serpentine path that wraps around the cuts. This geometry allows a wide range of resistances to be created with a single areal film/conductor layout. The approach outlined above would process a sequence of serpentine cuts with measurement steps at a resistor site and then move to the next resistor.

Referring to FIG. 2a, an initial laser position for any cut is depicted as 205, and a beam positioner directs the beam along the linear path through the resistor material. In accordance with the present invention, a new paradigm trims a leg on a first resistor (e.g. trim cut 204 of R1) and measures the resistance. If the resistance is below a predetermined threshold, similar collinear trims across other resistors R2 . . . RN in the row are made. A completed collinear trim along the row is illustrated at 210 in FIG. 2a, and the corresponding block 220 is further defined in FIG. 2b. In at least one embodiment of the present invention, a subset of resistors may be measured to determine thin film consistency across the substrate, but if the thin film is of known consistency one measurement may be sufficient.

Figures 2B, 4B:
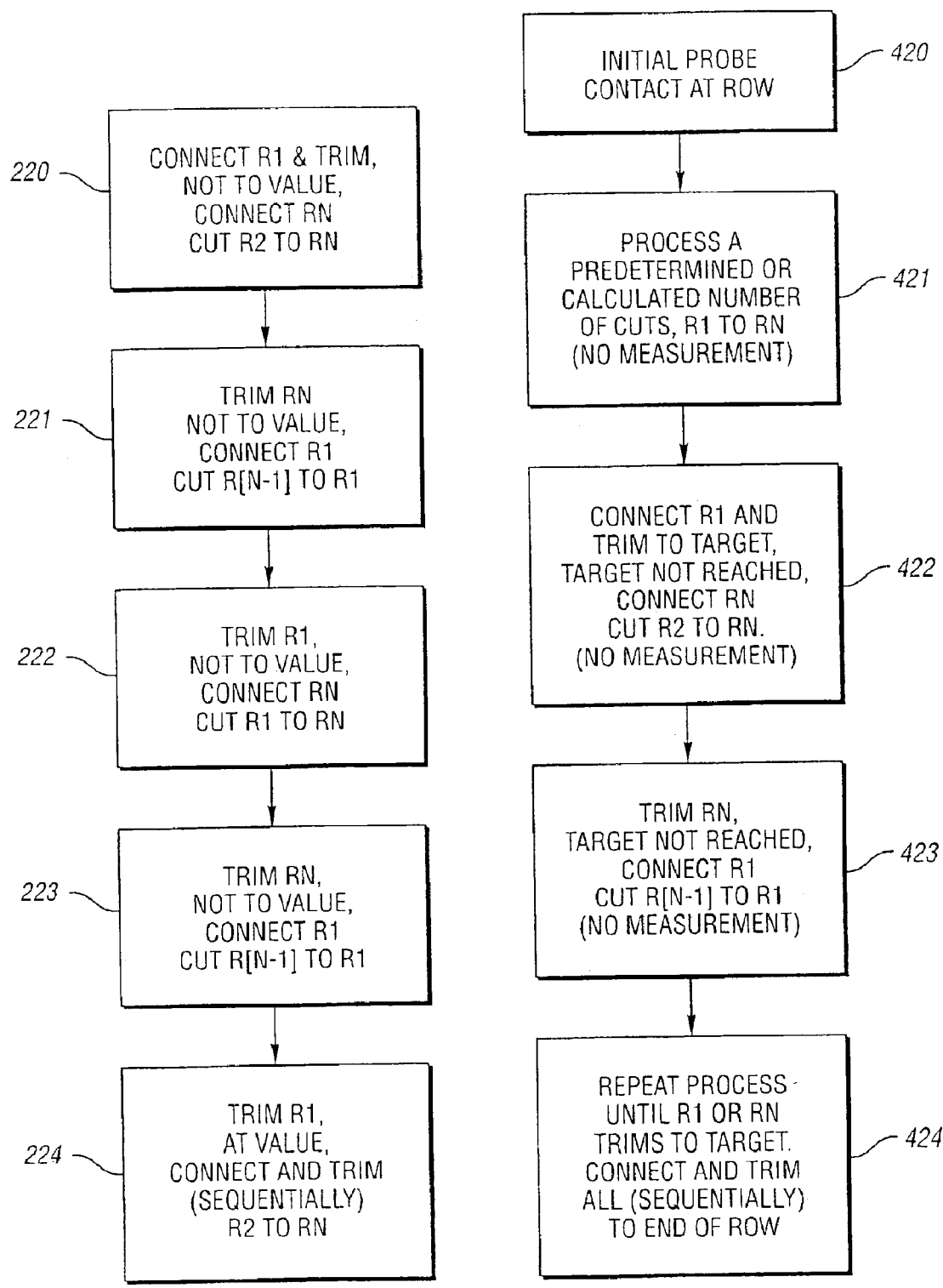

The next collinear group of cuts along resistors of the row is made in the same manner as shown at 211 of FIG. 2a and further defined at block 221 of FIG. 2b, the resistor RN being trimmed initially. The process is repeated as shown in 212–213 of FIG. 2a with corresponding further defined at blocks 222–223 of FIG. 2b. If a measurement shows that a threshold has been crossed, trimming of the row R1 . . . RN proceeds with measurement of each resistor so as to trim to value before switching to the next resistor (depicted as 214 at block 224).

Limiting the number of measurements and maintaining a collinear trim trajectory both increase trim speed.

Figure 3:
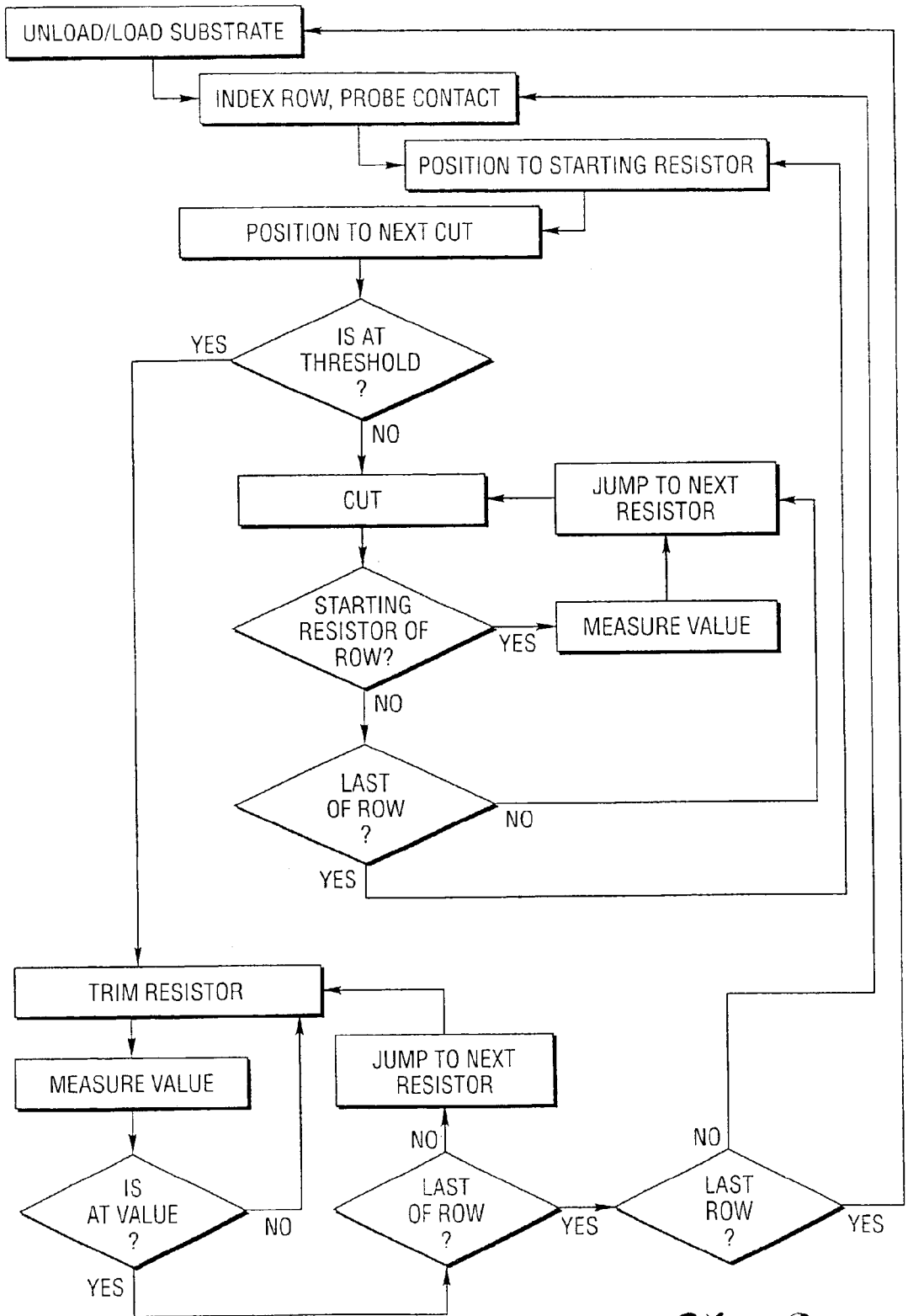
FIG. 3 is a block diagram flow chart further defining the trimming operations of FIGS. 2a and 2b in a system of the present invention.

The flowchart of FIG. 3 further defines steps, corresponding to FIGS. 2a–2b, and additional processing steps used in a trimming system (e.g.: indexing and loading).

In at least one embodiment, cutting steps may be carried out based upon pre-determined information. By way of example, for some resistor types, a first series of elements may be cut before resistance is measured, the sequence based on pre-determined parameters of the resistor (e.g.: geometry) and/or known film properties, (e.g: sheet resistance). Similarly, a number of non-measured cuts may be determined in a learn mode at the first resistor (e.g: including at least one measurement, or iterative measurements). In one learn mode, iterative measurements are made and the number of non-trim cuts is determined based on the measurements and material properties. In at least one embodiment a number of the non-measured cuts may be calculated.

Figure 4A:
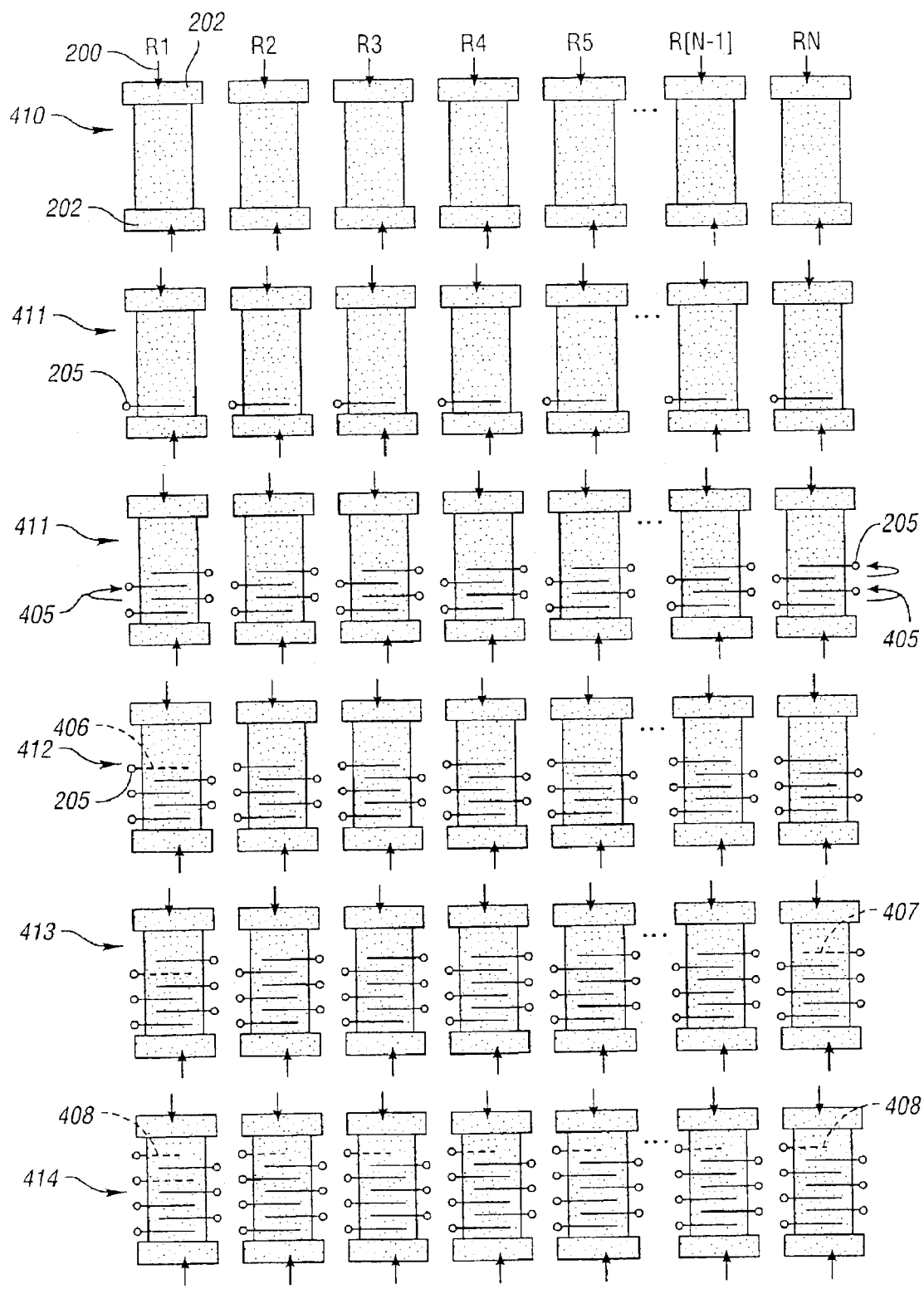
FIG. 4a is a schematic view of an array of chip resistors arranged in rows and columns and which illustrates results using laser trimming steps in accordance with another embodiment of the present invention.

For example, four cuts may be made without measurement. Referring to FIG. 4a, an initial condition 410 is illustrated wherein probes are placed in contact 202 with the row as in FIG. 2a. Referring to FIG. 4b, the initial condition is further defined at block 420. By way of example, FIGS. 4a–4b illustrate an embodiment of the trimming process wherein initially four cuts 411 are made without any measurement. As shown in FIG. 4b, block 421 defines a predetermined number of cuts (e.g: four), without measurement, based on at least one pre-trim value or condition. The scan path for completing four cuts is depicted at 405. Then the first resistor R1 in the row is trimmed at 406 and measured to determine if the target value is reached. If not, the remaining resistors R2 . . . RN are cut (e.g.: without measurement) as depicted at 412, further defined by block 422.

Then the process is repeated, beginning with trimming 407 of RN, and then cutting of R[N–1] to R1 as shown at 413 and further defined by block 423. Hence, with each change in direction either R1 or RN is trimmed, and if the target value is not reached the remaining resistors R2 . . . RN or R[N–1 ] . . . R1, respectively, are cut. A final step results after R1 or RN reaches a target value. Each resistor is connected and trimmed sequentially, illustrated at 414 and further defined by block 424.

Figure 5:
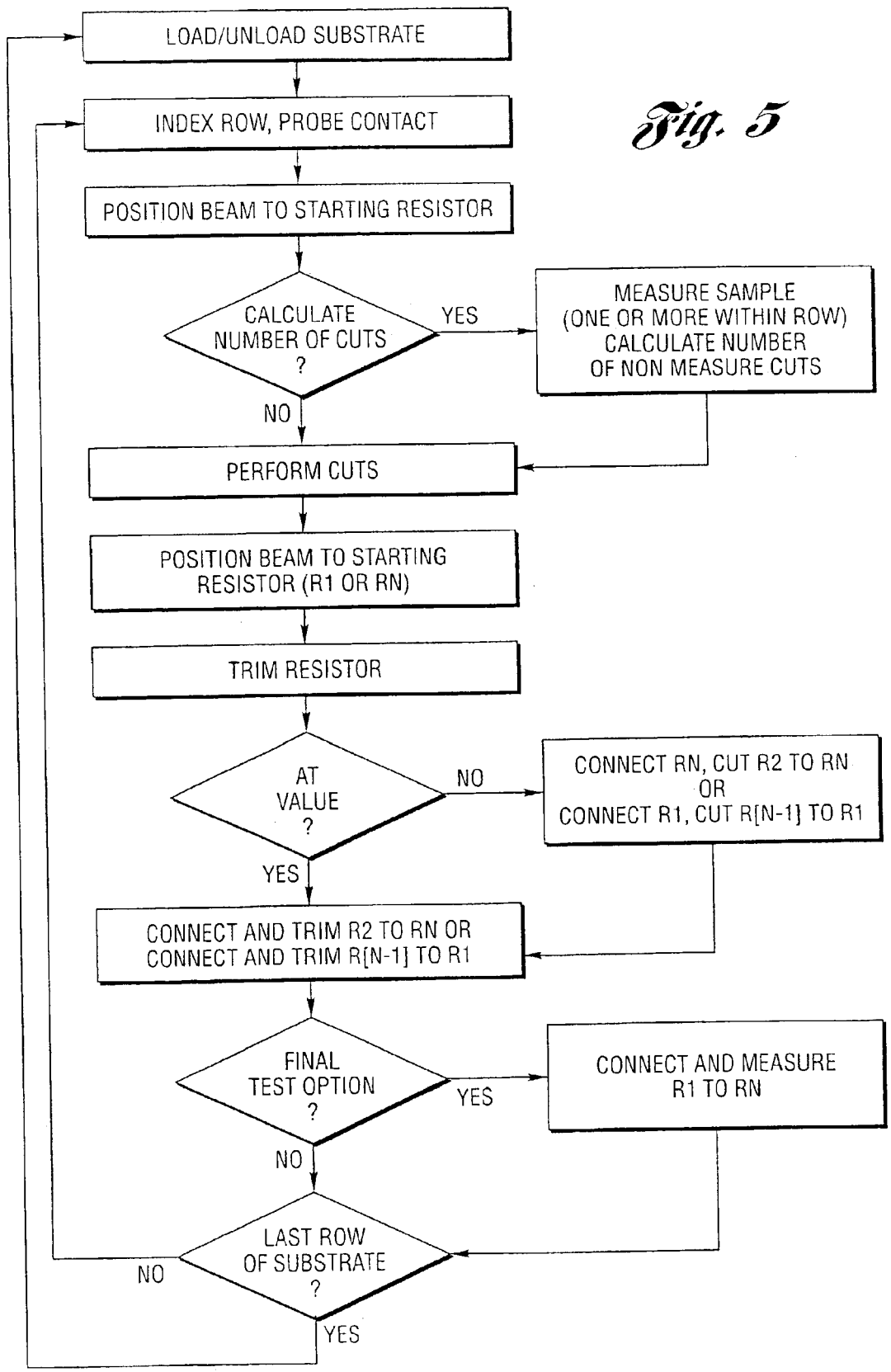
FIG. 5 is a block diagram flow chart further defining the trimming operations of FIGS. 4a and 4b in a system of the present invention.

The flowchart of FIG. 5 further defines steps corresponding to FIGS. 4a–4b, and additional processing steps used in a trimming system (e.g.: which includes the steps of indexing and loading).

In one embodiment, wherein pre-determined information is obtained using iterative measurements, pre-trim values are provided. The values may be specified by an operator, process engineer, or otherwise obtained. The software provides capability for specifying or using the pre-trim target values so that the applied test voltage and/or current is controlled. This feature is useful for avoiding voltages that are high enough to damage the part over the wide range of resistance change associated with serpentine trimming. When using a fast resistor measurement system in an embodiment of the invention, the voltage applied to the resistor for measurement is decreased for the initial low resistance cut to limit current through and potential damage to the resistor. As subsequent cuts are made and the resistance increases, the measurement voltage is increased.

The exemplary trim and cut sequences of FIGS. 2a and 2b and 4a and 4b may be modified so as to allow for variations in material properties and other process parameters and tolerances.

For example, in at least one embodiment of the present invention, additional steps may be utilized when a measured trim cut reaches the target value and length is within a predetermined margin of the maximum allowed cut length. Within the margin, variation in the material properties may leave some trim cuts short of the target value and require additional cuts.

In a first mode, trim cuts are made sequentially in a row of elements and the location of elements not reaching the target value are saved. With subsequent trim cuts, the remaining elements at the saved locations are trimmed to the target value.

In a second mode, based on the length of the first element trimmed to value, the cut length is reduced to prevent the target value from being reached and non-measurement cuts are processed to complete the row. Subsequent trim cuts bring all elements in the row to the target value.

In a third mode, the length of at least one prior cut on an element is modified to prevent subsequent cuts from falling into the marginal condition.

In at least one embodiment, additional steps may be utilized when the value of a measured trim cut is within a predetermined margin of the target value. Within the margin, variation in the material properties may leave some elements beyond the target value using full non-measurement cuts.

In a first mode, trim cuts are made sequentially in a row of elements and the location of elements not reaching the target value are saved. With subsequent trim cuts, the remaining elements at the saved locations are trimmed to the target value.

In a second mode, based on the value measured in the first element, the cut length is reduced to prevent the target value from being reached and non-measurement cuts are processed to complete the row. Subsequent trim cuts bring all elements in the row to the target value.

In a third mode, the length of at least one prior cut on an element is modified to prevent subsequent cuts from falling into the marginal condition.

Experimental data indicates improvements in throughput by cutting all the resistors in a row as shown in FIGS. 2–4, as opposed to the conventional single resistor trim technique. By way of example, approximate results are shown in the table below:

| 32 RESISTOR ROW, 20 CUTS PER RESISTOR | | |
| --- | --- | --- |
| Laser Q-Rate (KHz) | Single Resistor Trim (Sec) | Row Trim (Sec) |
| 5 | 39 | 28 |
| 10 | 27 | 16 |
| 20 | 20 | 10 |

The overall trim speed increases with an increasing number of resistors in a row, fewer measurements, and with reduced time for final (i.e., fine) trimming.

Further, each resistor has additional time to recover from laser generated energy. The sequence of cuts may be determined to manage temperature change in an element (e.g. reduce maximum element temperature during cutting). For example, with reference to FIG. 4a, the sequence 405 may be reversed so that a set of cuts are made starting near the center of an element and progressing to an end of the element approaching the conductor and probe. Other sequences, suitable sequences may be used (e.g: any sequence of non-adjacent cuts having advantage for thermal management). Preferably, a second element may be cut prior to an additional step of measuring.

Range of resistance change for serpentine cuts varies from about 1 order of magnitude (e.g: 10×), two orders of magnitude typical (100×), and up to about 500× with current materials.

Laser Trimming Systems

In at least one embodiment of the invention a laser trimming system may be first calibrated using a method as described in "Calibrating Laser Trimming Apparatus", U.S. Pat. No. 4,918,284. The '284 patent teaches calibrating a laser trimming apparatus by controlling a laser beam positioning mechanism to move a laser beam to a desired nominal laser position on a substrate region, imprinting a mark (e.g., cutting a line) on a medium to establish an actual laser position, scanning the imprinted mark to detect an actual laser position, and comparing the actual laser position with the desired nominal position. Preferably, the laser beam operates on one wavelength, and the mark is scanned with a detection device that operates on a different wavelength. The detection device views a field that covers a portion of the overall substrate region, and determines the position of a mark within the field. The '284 patent further teaches determining where a beam position is in relation to a camera field of view.

Other calibration techniques may be used alone or in combination with the '284 method. For instance, U.S. Pat. No. 6,501,061 "Laser Calibration Apparatus and Method," discloses a method of determining scanner coordinates to accurately position a focused laser beam. The focused laser beam is scanned over a region of interest (e.g. an aperture) on a work-surface by a laser scanner. The position of the focused laser beam is detected by a photodetector either at predetermined intervals of time or space or as the focused laser beam appears through an aperture in the work surface. The detected position of the focused laser beam is used to generate scanner position versus beam position data based on the position of the laser scanner at the time the focused laser beam is detected. The scanner position versus beam position data can be used to determine the center of the aperture or the scanner position coordinates that correspond with a desired position of the focused laser beam.

Subsequent to system calibration, which preferably includes calibration of numerous other system components, at least one substrate having devices to be trimmed is loaded into the trimming station.

Figures 6A, 6B:
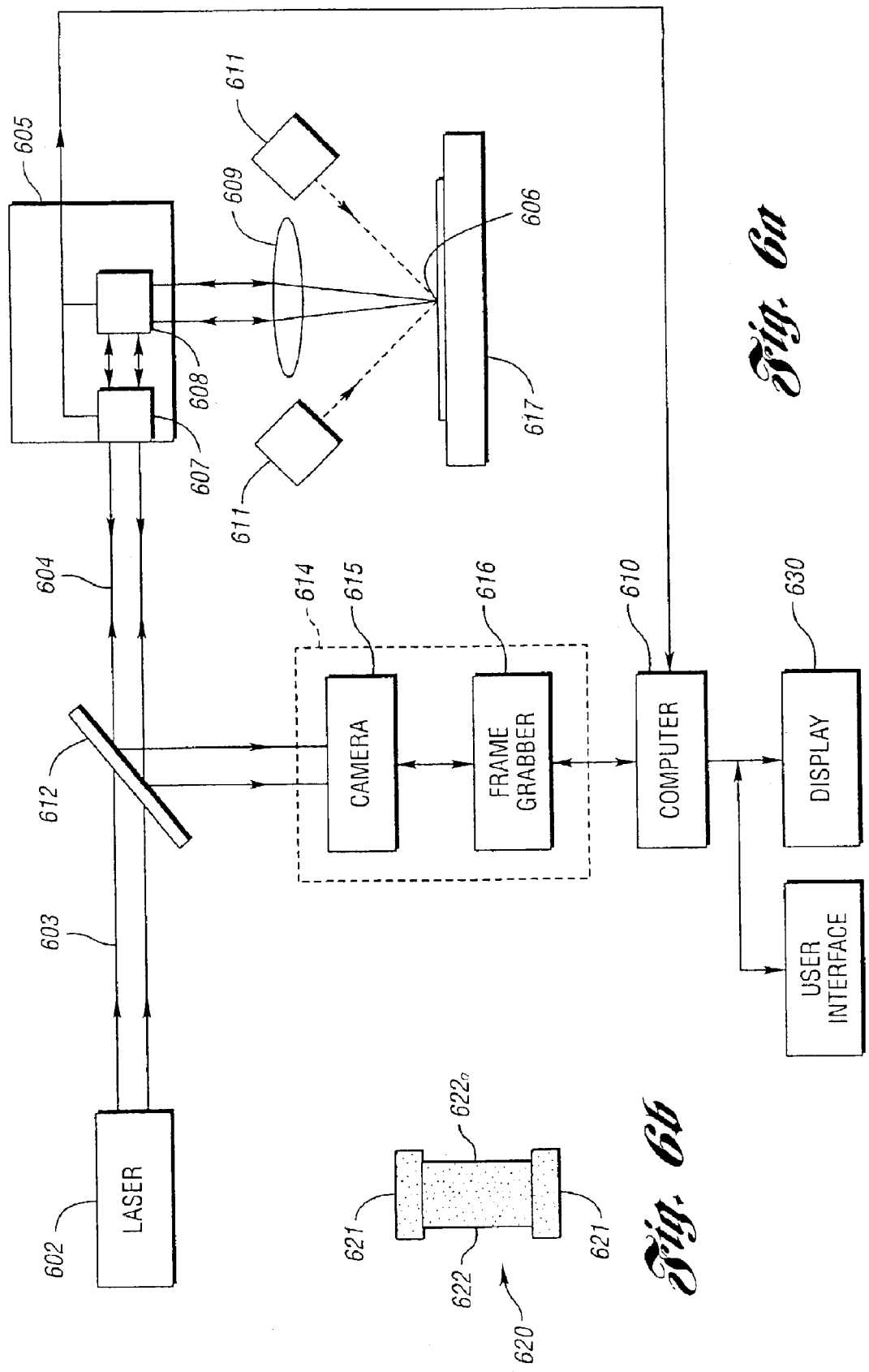

Referring to FIG. 6a, partially incorporated from the '284 patent, an improved laser trimming system may include an infrared laser 602, typically having a wavelength from about 1.047 microns—11.32 microns which outputs a laser beam 603 along an optical path 604 to and through a laser beam positioning mechanism 605 to a substrate region 606. For application to trimming of thin film arrays, a preferred wavelength of about 0.532 microns may be obtained by doubling the output frequency of the IR laser using various techniques known in the art and commercially available.

The laser beam positioning mechanism 605, preferably includes a pair of mirrors and attached respective galvanometers 607 and 608 (various available from the assignee of the present invention). The beam positioning mechanism 605 directs the laser beam 603 through a lens 609 (which may be telecentric or non-telecentric, and preferably achromatized at two wavelengths) to a substrate region 606, over a field. The X-Y galvanometer mirror system may provide angular coverage of the entire substrate if sufficient precision is maintained. Otherwise, various positioning mechanisms may be used to provide relative motion between the substrate and the laser beam. For instance, a two-axis precision step and repeat translator illustrated schematically as 617 may be used to position the substrate within the field of galvanometer based mirror system 607, 608 (e.g.: in the X-Y plane). The laser beam positioning mechanism 605 moves the laser beam 603 along two perpendicular axes thereby providing two dimensional positioning of the laser beam 603, across the substrate region 606. Each mirror and associated galvanometer 607, 608 moves the beam along its respective x or y axis under control of a computer 610. Illumination devices 611 which may be halogen lights or light emitting diodes produce visible light to illuminate substrate region 606.

A beam splitter 612 (a partially reflective mirror), is located within the optical path 604 to direct light energy reflected back along the path 604 from the substrate region 606 to a detection device 614. The detection device 614 includes a camera 615, which may be a digital CCD camera (e.g.: color or black/white) and associated frame grabber 616 (or digital frame buffer provided with the camera), which digitizes the video input from the television camera 615 to obtain pixel data representing a two-dimensional image of a portion of the substrate region 606. The pixel data are stored in a memory of the frame grabber 616, or transmitted, for instance, by a high speed link, directly to the computer 610 for processing.

The beam positioning subsystem may include other optical components, such as a computer-controlled, optical subsystem for adjusting the laser spot size and/or automatic focusing of the laser spot at a location of the substrate.

In applying the invention to thin film trimming of resistor arrays, at least one thin film array is supported by the substrate. The calibration data obtained as above is preferably used in combination with an automated machine vision algorithm to locate an element (e.g. resistor RI) of the array and measure the location of at least one geometric feature of an element 620 of FIG. 6b. For instance, the feature may be one of the horizontal edges 621 (e.g.: an edge parallel to the X-direction), and one of the vertical edges 622 (e.g.: an edge parallel to the Y direction) found by analysis of pixel data in memory using one of numerous available edge detection algorithms. The edges may include multiple edge measurements along the entire perimeter of a resistor, a sample of the edges, or edges from numerous resistors of the array. The width of the resistor is then determined which may be used to define the cutting length, typically as a predetermined percentage of the width. Preferably, the edge information is obtained automatically and used with calibration data to control the length of each cut within the row R1 ... RN, for example. Other measurement algorithms may also be used where suitable, for instance image correlation algorithms or blob detection methods.

Calibration may be applied at one or more points along the cut. In at least one embodiment the starting point of at least one cut will be corrected with calibration data.

Preferably, the length and the starting point of a plurality of cuts in FIGS. 2 and 4 will be corrected.

Most preferably, the length and starting point of all cuts in FIGS. 2a and 4a will be corrected.

In one embodiment, the first resistor (e.g.: R1 or RN) will be calibrated, and a corresponding correction applied to all resistors (e.g.: R1, ... ,RN) of the row.

Complete automation is preferred. However, a semi-automatic algorithm with operator intervention may be used, for instance where a galvanometer is positioned so that the array element 620 is in the field, then the beam is sequentially positioned along the element interactively and the intensity profile (or derivative or intensity) observed on a display 630 by an operator.

The use of the calibration information to adjust coordinates within the array region is valuable for improving the precision of laser beam positioning without throughput degradation. Measurements of resistor width and the alignment data is useful for both controlling the length of a cut and for correcting deviations from linearity and non-orthogonality of the array relative to the scanner X,Y coordinate system. The use of the calibration data for geometric correction is particularly well suited for use in laser trimming systems having one or more linear translation stages.

Geometric correction does not necessarily replace other useful system design features including f-theta lens linearity, fan beam compensation etc. The system tolerance stack-up may generally be used to determine tradeoffs between the number of cut calibration locations based on expected position error. When fanning out the beam, especially with large spacing across many resistors, only one is calibrated and aligned. For instance, when the spacing between resistors is relatively large, a single cut may be calibrated and aligned. Resulting errors in position are anticipated at elements, to be mitigated in part with system design, f-theta linearity, fan spread compensation etc. Closely spaced cuts of a transverse fan are expected to have smaller errors compared with on axis fan.

Further Throughput Improvements—Optical Techniques

In at least one embodiment of the present invention the throughput may be further improved by increasing the effective scan rate using one or more of the techniques below.

Further increases in processing speed with collinear trims can be accomplished with faster jumps across trim gaps between the resistors of a row. One such gap 216 is shown in FIG. 2a. Referring to FIG. 7, in at least one embodiment of the invention, a single-axis Acousto-Optic Beam Deflector (AOBD) superimposes a saw tooth linear scan pattern 701 as the galvanometer scans across the row at a constant velocity 702. During trimming the AOBD scans in retrograde motion 703, and, between trims, provides a fast jump 704 to the next cut. This allows the galvanometer to scan at constant velocity and minimizes the contributions of jumps to the total process time.

The use of acousto-optic deflectors in combination with galvanometers for speed improvements is known in the art. For instance, U.S. Pat. No. 5,837,962 discloses an improved apparatus for heating, melting, vaporizing, or cutting a workpiece. A two-dimensional acousto-optic deflector provided about a factor of five improvement in marking speed.

U.S. Pat. No. 6,341,029, which is incorporated by reference in its entirety, shows in FIG. 5 thereof an embodiment having several components which may be used in a complete system when practicing the present invention in a retrograde mode for increased speed. In the '029 patent, acousto-optic deflectors and galvanometers, with an associated controller, are shown for dithering CW beams for laser patterning. Also see col. 3, line 47 and col. 4 of the '029 patent for additional details regarding system construction.

The arrangement of the '029 patent may be readily adapted, using available techniques, so as to provide modifications of optical components and scan control profiles so as to practice the retrograde scanning technique of the present invention, preferably with additional hardware calibration procedures.

In another embodiment of the invention, the collinear trims on serpentine resistors may be accomplished in a parallel fashion with multiple spots along the row. A fan-out grating or other multi-beam generating device is used to create a spot array so that 2 or more spots are formed and aligned according to the resistor pitch along the row. For example, U.S. Pat. No. 5,521,628 discloses the use of diffractive optics to simultaneously mark multiple parts. The multiple beams may be lower power beams generated from a more powerful laser source, or combined beams from multiple sources. The scan system scans the multiple beams and forms spots through a common scan lens simultaneously across multiple resistors. The trim process is similar to the single spot method with two or more cuts in parallel during non-measurement cutting steps. When the threshold is reached, the system converts to a single spot mode to serially trim each resistor to value.

Similarly, the collinear trims on serpentine resistors may be accomplished in a parallel fashion with multiple spots formed on a target to make parallel cuts. A fan-out grating or other multi-beam generating device is used to create a spot array so that 2 or more spots are formed, the spots being aligned to an element with predetermined spacing between cuts. If a predetermined number of cuts are performed (e.g. four as shown in FIG. 4a) then, in one embodiment, the number of passes could be reduced by 50% (e.g.: a single pass in each direction). This embodiment may be most useful if resistor process variations and tolerances are well established. The grating may be in an optically switched path so as to selectively form multiple spots or a single spot.

Published U.S. patent application No. 2002/0162973 describes a method and system for generating multiple spots for processing semiconductor links for memory repair. Various modifications in the lens system and deflector system may be used to generate multiple spots for use in the present invention.

In one embodiment, a single laser pulse is used to trim up to two resistors at one time (e.g., no, one or two cuts). Referring to FIG. 8, two focused spots 801,802 are formed on two cuts by spatially splitting the single collimated laser beam 803 into two diverging collimated beams 804,805. Fine adjustment of the differential frequency controls spot separation. The use of acousto-optic devices for spatially splitting beams in material processing applications is known in the art. For example, Japanese patent abstract JP 53152662 shows one arrangement for drilling microscopic holes using a multi-frequency deflector having selectable frequencies f1 . . . fN.

A laser 806 of FIG. 8 is pulsed at a predetermined repetition rate. The laser beam goes through relay optics 807 that forms an intermediate image of the laser beam waist into the acoustic optic modulator (AOM) aperture. The AOM 808, which operates in the Bragg regime, preferably is used to controllably generate the two slightly diverging collimated first order diffraction laser beams and control the energy in each beam. The AOM is driven by two frequencies, f1 and f2 where f1=f0+df and f2=f0−df where df is a small percentage of the original RF signal frequency f0. The angle between the two beams is approximately equal to the Bragg angle for f0 multiplied by 2(df/f0). The AOM controls the energy in each of the laser beams by modulating the signal amplitudes of two frequency components, f1 and f2, in the RF signal 812 and making adjustments for beam cross-coupling.

After exiting the AOM 808, the beams go through an optional beam rotation control module 809 to rotate the beam 90 degrees so as to orient the beam in either X or Y. In one embodiment, a prism is used for this rotation, though many rotation techniques are well known as described in related U.S. patent publication No. 2002/0170898.

Next, the beam goes through a set of optics to position the beam waist and set the beam size to be appropriate for the zoom optics and objective lens 810. The zoom optics also modify the angle between the two beams, therefore the angle between the two beams exiting the AOM 808 has to be adjusted depending on the zoom setting to result in the desired spot separation at the focal plane. Next, the laser beams enter the objective lens 810 which provides a pair of focused spots 801,802 on two resistors. The two spots are separated by a distance that is approximately equal to the focal length of the lens 810 times the angle between the two beams. The retrograde and parallel methods can be combined for collinear trimming on serpentine resistors. For example, a beam is scanned by an AOBD then split into a pair and scanned across the field. Two adjacent resistors are trimmed simultaneously and the jump is from resistor N to resistor N+2 to the next pair or resistors.

Alternatively, or with a two-dimensional deflector, a pair of spots may be produced in a direction orthogonal to the serpentine scan direction. For instance, with relatively simple control and programming of a one-dimensional AOBD, the deflector may be used (with appropriate output power control) to simultaneously produce at least two of the four beams used for making four cuts as shown in FIG. 4a. As such, the scan time for the cuts may be reduced by 50%. As a result of programmable deflection, the AOBD may be preferred over a fan out grating. The multiple spots may also be produced during coarse and fine trim as needed.

Figure 9:
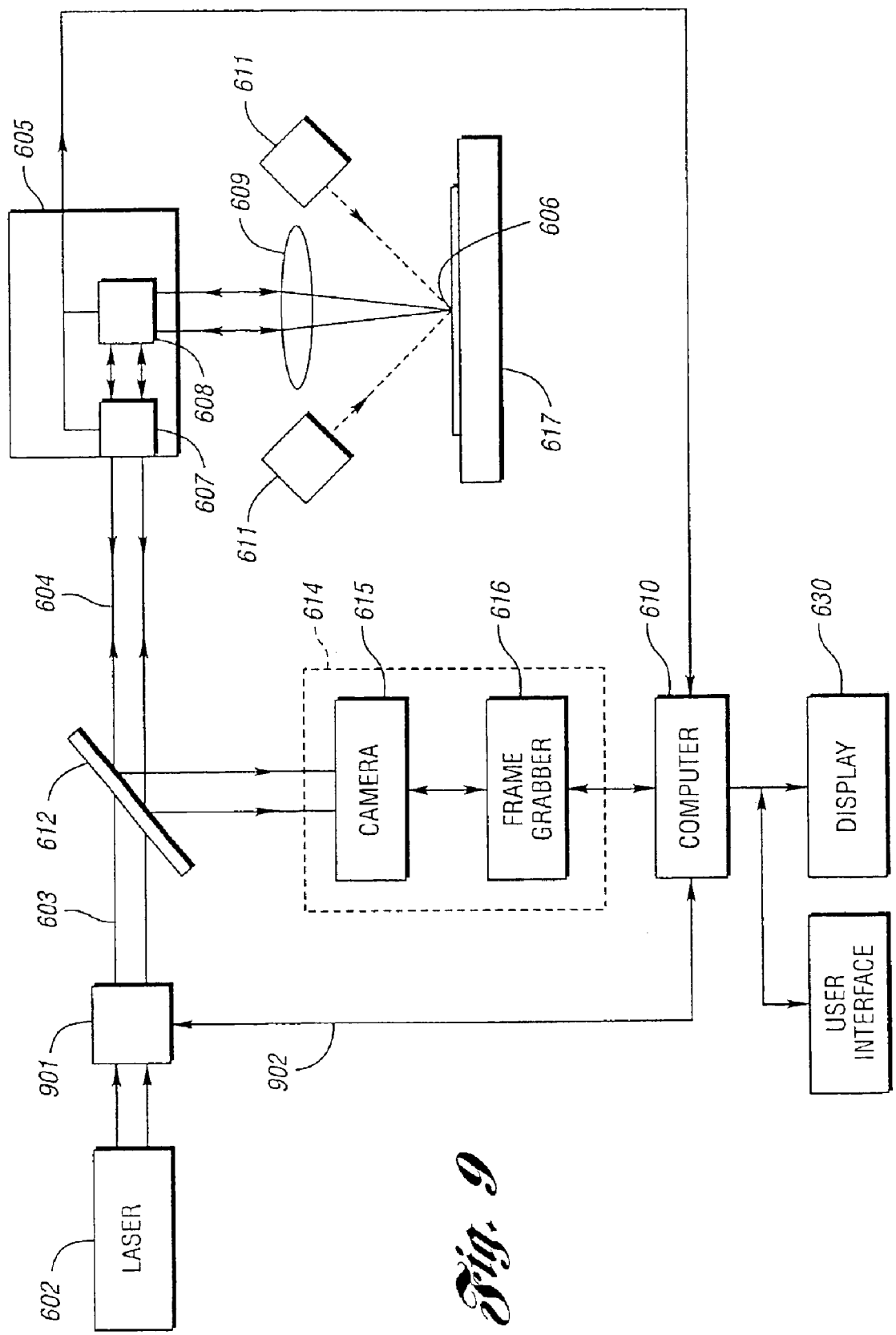
FIG. 9 is a schematic view of a system which provides multiple beams to at least one resistor in a laser trimming system.

FIG. 9 illustrates schematically an exemplary embodiment of an improved laser trimming system having a module 901 from FIG. 8 added for either retrograde scanning, parallel processing, or a combination thereof. For example, a signal 902 from the computer 610 may be used to control the AOBD or other solid state deflector 808 in one or more axes, and the beam rotation module 809, if provided. The module 901 may include relay optics 807 and other beam shaping components. Preferably, at least one AOBD is used so as to provide considerable flexibility and ease of use, for example with a digital RF generator providing the control signal 812 from the computer 610.

Furthermore, techniques for forming elongated or elliptical spots can be employed with this invention to further increase processing speed or quality. Improvements in trimming speed associated with spot shaping are described in co-pending published U.S. patent application No. 2002/0170898.

Numerous other design alternatives may be used in at least one embodiment of the invention for enhancing system performance and ease of use. For example, alternatives include but are not limited to the following:

1. The system may provide for computer-controlled spot size and/or focus adjustments. U.S. Pat. No. 6,483,071, assigned to the assignee of the present invention, illustrates an optical subsystem providing for both spot size control and dynamic focus for laser based memory repair.

2. Another alternative is control of beam energy with a variable beam attenuator. The attenuator may be an acousto-optic deflector (or modulator). Neutral density filters or polarization-based attenuators may be used, whether manually or automatically adjusted. In U.S. Pat. No. 6,518,540 a suitable variable attenuator is shown, by way of example, having a rotating half waveplate and a polarization-sensitive beam splitter.

3. The pulse width may be varied using methods known to those skilled in the art, with the understanding that the energy of a q-switched laser will vary with repetition rates, particularly at high repetition rates. For dynamic trimming, wherein a measurement is performed between pulses, it may be preferred to maintain substantially constant pulse energy. A method for pulse energy control is disclosed in the 6,339,604 patent which reduces the variation in energy at the target as the trimming speed is decreased (e.g.: larger pulse temporal spacing), corresponding to periods of precision measurement when the resistance value approaches the pre-determined target value.

4. In at least one embodiment, a diode-pumped, frequency-doubled, YAG laser is used to trim the resistor array. The output wavelength of 532 nm resulted in low drift, absence of microcracking, and negligible heat affected zone when compared to other wavelengths. A pulse width of about 25–45 ns may be preferred, with less than 30 ns typical. The preferred maximum laser repetition rate will be at least 10 KHz. The pulse width, much less than typical for thick film systems, provides for thin film material removal at a relatively high repetition rate. Preferably, the maximum available pulse energy at the reduced pulse widths and high repetition rates will allow for losses associated with the diffractive optics (e.g: grating or AOBD) so that multiple spots may be provided.

5. The laser may be focused to an approximate, diffraction-limited, spot size. The spot size will typically be less than about 30 microns or less, with a preferred spot size less than about 20 microns, and a most preferred spot size in the range of about 6–15 microns, for instance, 10–15 microns.

6. In the illustrated embodiments of the invention, serpentine cuts are illustrated as a series of parallel interdigitated cuts. However, it is to be understood that application of the present invention is not restricted to forming parallel cuts. Trimming or micromachining so as to produce a plurality of non-intersecting cuts with a reduced number of measurements is considered to be within the scope of the invention.

7. Further, embodiments of the invention are not restricted to thin film resistor measurements, but are applicable to other micromachining applications wherein a physical property is measurable. The measurement is not restricted to electrical measurements, but may be temperature monitoring (for instance, with an infrared sensor), stress, vibration, or other property.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A system for high-speed, laser-based, precise laser trimming at least one electrical element having at least one measurable property, the at least one element being supported on a substrate, the system comprising:
    a laser subsystem to generate a pulsed laser output having one or more laser pulses at a repetition rate, each laser pulse having a pulse energy, a visible laser wavelength, and a pulse duration;
    a beam delivery subsystem that accepts the pulsed laser output and includes:
        at least one beam deflector to position the one or more laser pulses relative to the at least one element to be trimmed; and
        an optical subsystem to focus the one or more laser pulses having the visible laser wavelength into at least one spot within a field of the optical subsystem; the at least one spot having a non-uniform intensity profile along a direction and a spot diameter as small as about 6 microns to about 15 microns; and
    a controller coupled to the beam delivery and laser subsystems to control the beam delivery and laser subsystems to selectively irradiate the at least one element such that the one or more laser output pulses having the visible laser wavelength, the pulse duration, the pulse energy and the spot diameter selectively remove material from the at least one element and laser trim the at least one element while avoiding substantial microcracking within the at least one element.

2. The system of claim 1, wherein the spot is substantially diffraction limited, and wherein the non-uniform intensity profile is approximately a Gaussian profile along the direction.

3. The system of claim 1, wherein substantial microcracking is also avoided within material proximal to the at least one element.

4. The system of claim 1, wherein the laser subsystem includes a q-switched, frequency-doubled, diode-pumped, solid state laser.

5. The system of claim 1, wherein the laser subsystem includes a q-switched, frequency-doubled, solid state laser having a fundamental wavelength in the range of about 1.047 microns to 1.32 microns, and the visible output wavelength is a frequency-doubled wavelength in a visible wavelength range of about 0.5 microns to about 0.7 microns.

6. The system of claim 1, wherein the laser wavelength is a green laser wavelength.

7. The system of claim 6, wherein the green laser wavelength is about 532 nm.

8. The system of claim 1, wherein the spot diameter is as small as about 6 microns to about 10 microns.

9. The system of claim 1, wherein the optical subsystem includes a lens that is achromatized at two or more wavelengths, at least one of the wavelengths being a visible wavelength.

10. The system of claim 9, further comprising:
    an illuminator to illuminate a substrate region with radiant energy at one or more illumination wavelengths; and
    a detection device having sensitivity to the radiant energy at one of the illumination wavelengths wherein one of the two or more wavelengths is a visible laser wavelength and the other is the illumination wavelength.

11. The system of claim 1, wherein the optical subsystem is a telecentric optical subsystem.

12. The system of claim 11, wherein the telocentric optic subsystem includes a telecentric lens.

13. The system of claim 1, wherein the repetition rate is at least 10 Kilohertz.

14. The system of claim 1, wherein the pulse duration of at least one laser pulse of the laser output is in the range of about 25 nanoseconds to about 45 nanoseconds.

15. The system of claim 1, wherein the pulse duration of at least one laser pulse of the laser output is less than about 30 nanoseconds.

16. The system of claim 1, wherein the controller includes means for controlling position of the pulsed laser output relative to the at least one element.

17. The system of claim 1, wherein the controller includes means for controlling the pulse energy to selectively irradiate the at least one element.

18. The system of claim 1, further comprising a substrate positioner to position the at least one element supported on the substrate relative to and within the field of the optical subsystem such that the one or more laser pulses are focused and irradiate the at least one element with a spot diameter as small as about 6 microns to about 15 microns.

19. The system of claim 1, wherein the optical subsystem receives the at least one laser pulse subsequent to deflection by the at least one beam deflector.

20. The system of claim 18, wherein the focused spot diameter is as small as about 6 microns to about 10 microns at any location within the field of the optical subsystem.

21. The system of claim 1, further comprising a calibration algorithm to adjust coordinates of material to be irradiated within the at least one element and to thereby precisely control a dimension of a region of material removal.

22. The system of claim 1, further comprising a machine vision subsystem including a vision algorithm to locate or measure at least one geometric feature of the at least one element.

23. The system of claim 22, wherein the vision algorithm includes edge detection and the at least one geometric feature are edges of the at least one element, the edges being used to determine width of the at least one element and to define a dimension for material removal.

24. The system of claim 1, wherein the at least one element includes a thin-film resistor, and wherein the at least one measurable property is at least one of resistance and temperature, and wherein the system further includes means for suspending removal of thin film material of the resistor when a measurement of at least one measurable property is within a predetermined range.

25. The system of claim 1, wherein a material of the substrate is a semiconductor.

26. The system of claim 1, wherein a material of the substrate is a ceramic.

27. The system of claim 1, wherein the at least one element includes a thin-film element.

28. The system of claim 1, wherein an array of thin-film electrical elements is to be trimmed with the system and wherein the controller includes:

means to selectively micromachine an array element to vary a value of a measurable property;

means to suspend the selective micromachining while the selective micromachining is suspended;

means to selectively micromachine at least one other array element to vary a value of a measurable property; and means to resume the selective micromachining to vary a measurable property of the array element until its value is within a desired range.

29. The system of claim 1, further comprising a user interface, and a software program coupled to the interface and the controller, the software program adapted to accept pre-trim target values for the at least one element and to limit an electrical output being applied to the at least one element based on the values.

30. The system of claim 29, wherein potential damage to the at least one element is avoided.

* * * * *